(12) United States Patent
Fischer et al.

(10) Patent No.: US 9,723,726 B2
(45) Date of Patent: Aug. 1, 2017

(54) FILM COMPOSITE HAVING ELECTRICAL FUNCTIONALITY FOR APPLYING TO A SUBSTRATE

(71) Applicant: Schreiner Group GmbH & Co. KG, Oberschleissheim (DE)

(72) Inventors: Wolfram Fischer, Neusaess (DE); Olaf Nitschke, Munich (DE); Thomas Samuel, Munich (DE); Oliver Wiesener, Munich (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 0 days.

(21) Appl. No.: 15/119,156

(22) PCT Filed: Feb. 25, 2015

(86) PCT No.: PCT/EP2015/053935
§ 371 (c)(1),
(2) Date: Aug. 16, 2016

(87) PCT Pub. No.: WO2015/128378
PCT Pub. Date: Sep. 3, 2015

(65) Prior Publication Data
US 2016/0381810 A1    Dec. 29, 2016

(30) Foreign Application Priority Data

Feb. 26, 2014 (DE) .......................... 10 2014 102 519

(51) Int. Cl.
*H05K 3/46* (2006.01)
*H05K 3/04* (2006.01)
(Continued)

(52) U.S. Cl.
CPC .................. *H05K 3/38* (2013.01); *B32B 3/10* (2013.01); *B32B 7/12* (2013.01); *H05K 3/043* (2013.01);
(Continued)

(58) Field of Classification Search
CPC ........ H05K 3/38; H05K 3/043; H05K 3/4652; H05K 2203/1545; B32B 3/10; B32B 2307/202; B32B 2457/08
See application file for complete search history.

(56) References Cited

U.S. PATENT DOCUMENTS 4,815,990 A * 3/1989 Ristedt ................... H01R 12/61
29/846
4,961,806 A    10/1990 Gerrie et al.
(Continued)

FOREIGN PATENT DOCUMENTS

AT    504 959 B1    9/2008
AT    504 406 B1    6/2009
(Continued)

OTHER PUBLICATIONS

International Search Report of PCT/EP2015/053935, mailed Jul. 22, 2015.

*Primary Examiner* — Hoa C Nguyen
(74) *Attorney, Agent, or Firm* — Collard & Roe, P.C.

(57) ABSTRACT

A film composite with electrical functionality for application on a substrate includes at least one conductive structure, a first bonding coat, a film layer and a second bonding coat. The first bonding coat is disposed on an underside of the at least one conductive structure, wherein the first bonding coat has an adhesive effect for application of the at least one conductive structure on the substrate. The second bonding coat is disposed between an upper side of the at least one conductive structure and the film layer. The second bonding coat has an adhesive effect, by which the film layer adheres to the at least one conductive structure.

15 Claims, 8 Drawing Sheets

Figure 3:
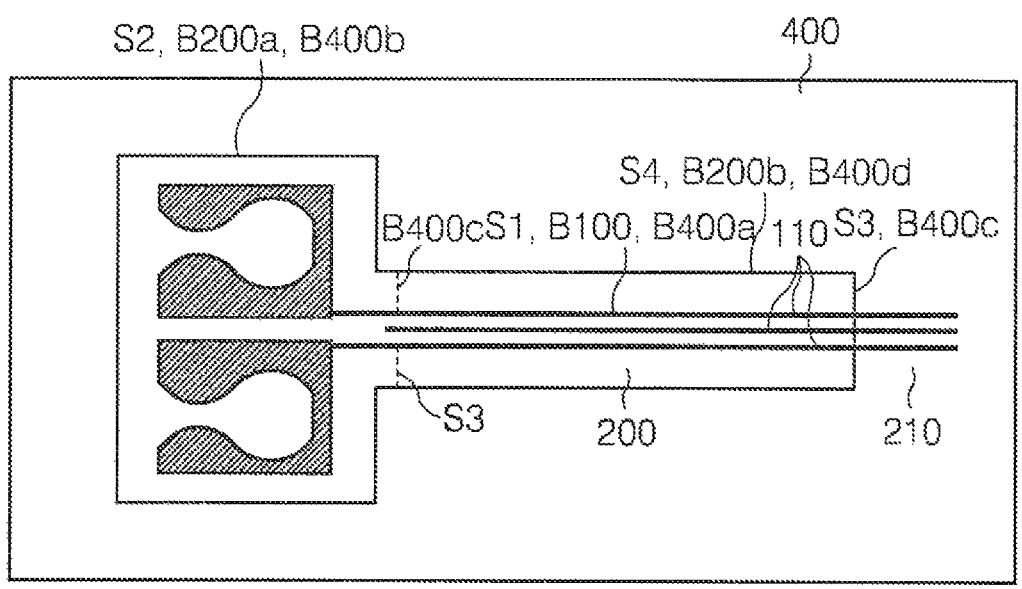

(51) Int. Cl.
*B32B 7/12* (2006.01)
*H05K 3/38* (2006.01)
*B32B 3/10* (2006.01)
*H05K 3/40* (2006.01)

(52) U.S. Cl.
CPC ......... *H05K 3/4635* (2013.01); *H05K 3/4652* (2013.01); *B32B 2307/202* (2013.01); *B32B 2457/08* (2013.01); *H05K 3/4084* (2013.01); *H05K 2203/1545* (2013.01)

(56) References Cited

U.S. PATENT DOCUMENTS

| | | | |
|---|---|---|---|
| 7,236,093 | B2 | 6/2007 | Stroemberg |
| 7,237,319 | B2 | 7/2007 | Kasahara et al. |
| 7,250,868 | B2 | 7/2007 | Kurz et al. |
| 8,371,509 | B2 | 2/2013 | Bohn |
| 8,745,852 | B2 | 6/2014 | Bohn |
| 2002/0009578 | A1 | 1/2002 | Watanabe et al. |
| 2007/0283997 | A1 | 12/2007 | Hachtmann et al. |
| 2008/0202676 | A1* | 8/2008 | Ueno .................. H05K 3/4691 156/247 |
| 2008/0250637 | A1 | 10/2008 | Zhang et al. |
| 2008/0295327 | A1 | 12/2008 | Aeling et al. |

FOREIGN PATENT DOCUMENTS

| | | | |
|---|---|---|---|
| AT | 506 111 | A2 | 6/2009 |
| DE | 10 2007 026 720 | A1 | 12/2008 |
| DE | 10 2007 041 752 | A1 | 3/2009 |
| DE | 10 2007 055 275 | A1 | 5/2009 |
| EP | 0 665 705 | B1 | 8/1995 |
| EP | 0 704 863 | B1 | 4/1996 |
| EP | 1 085 480 | B1 | 3/2001 |
| EP | 2 081 204 | A2 | 7/2009 |
| GB | 2 203 905 | A | 10/1988 |

\* cited by examiner

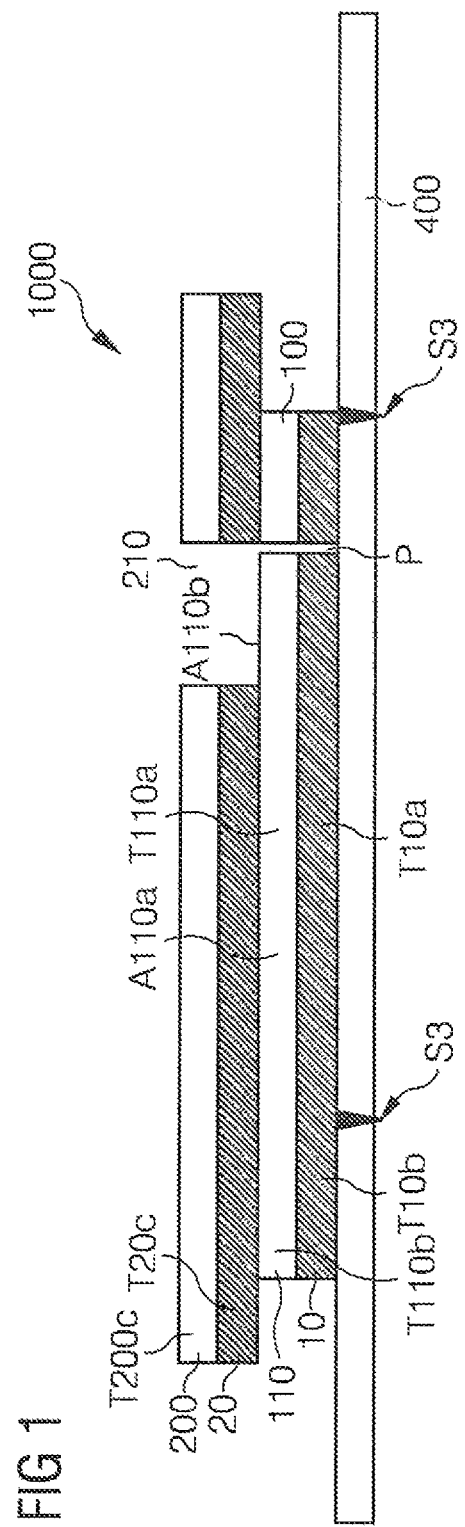

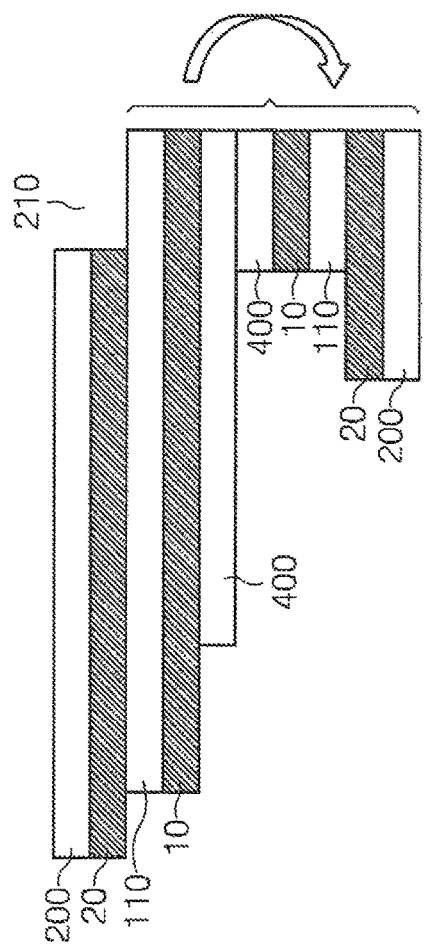
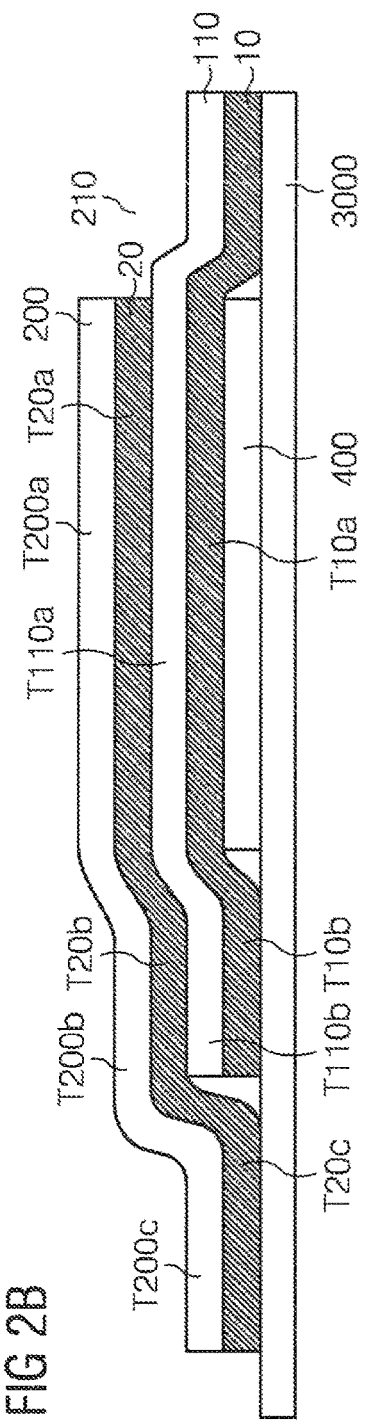
FIG 2A
FIG 2B

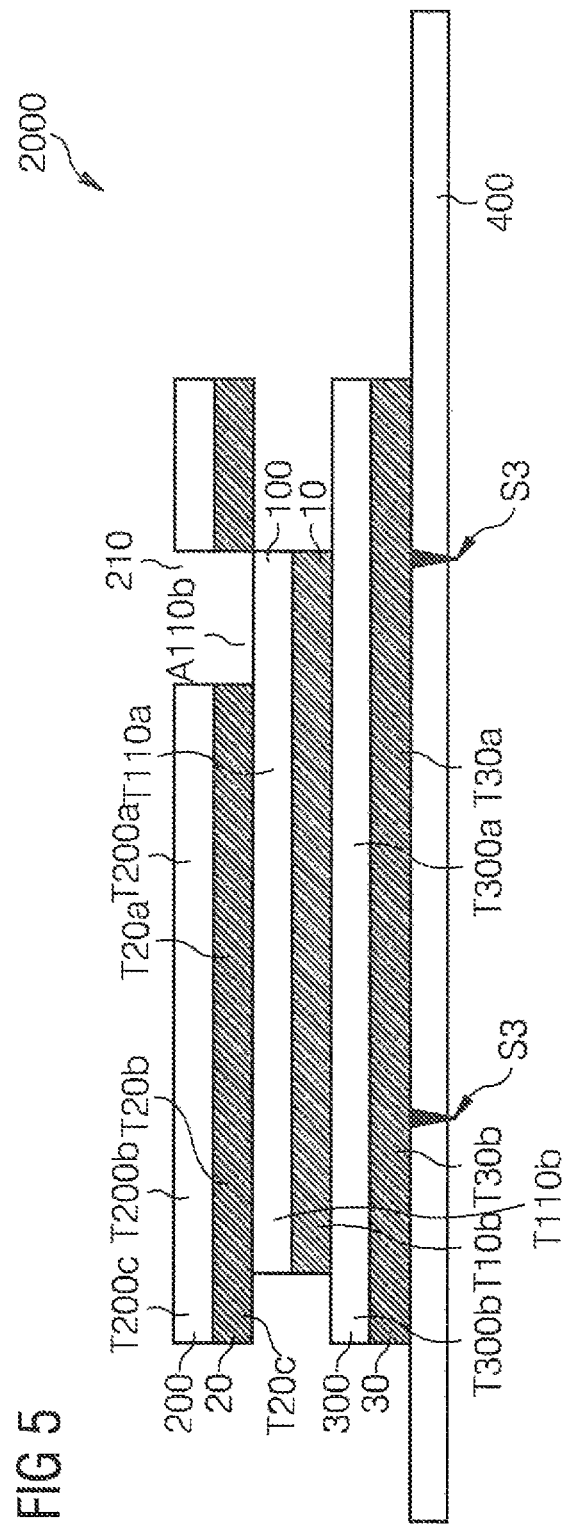

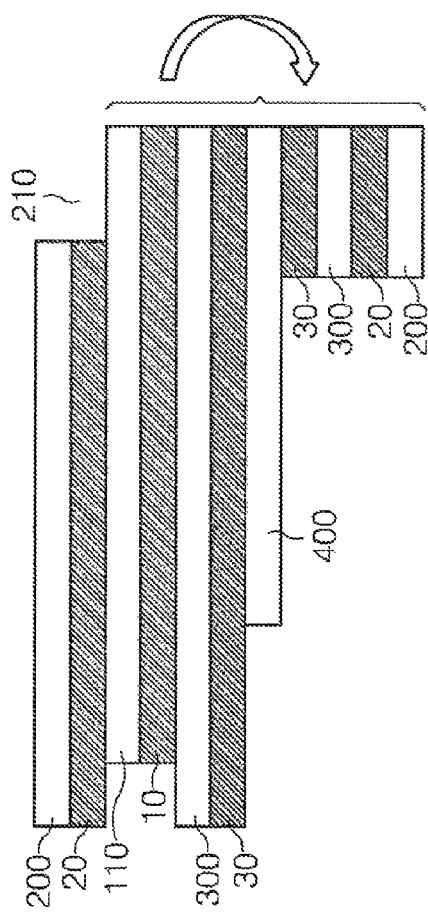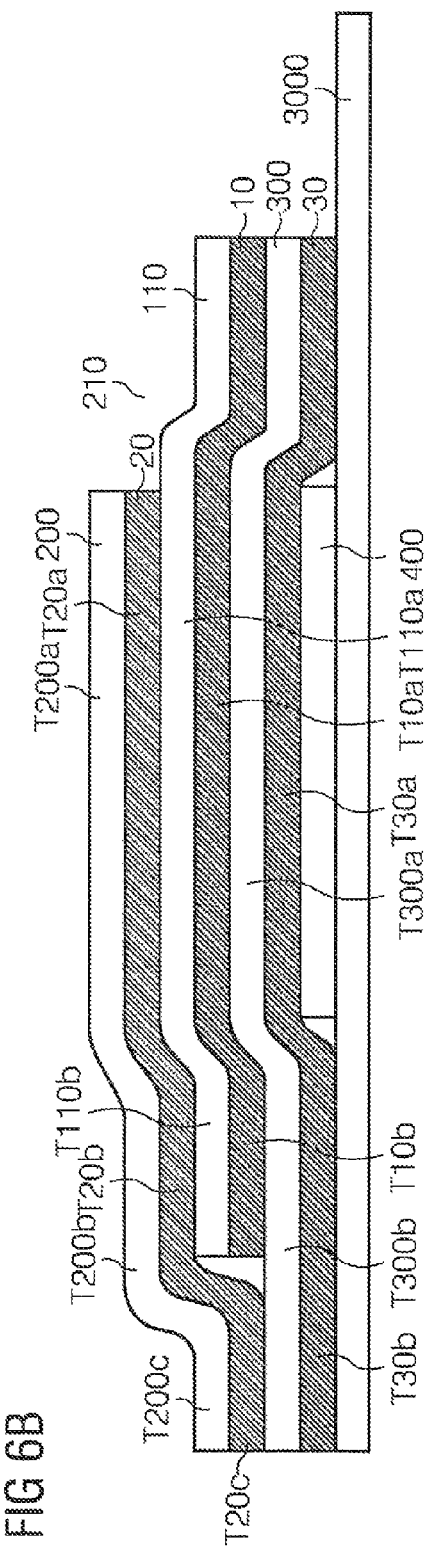

FILM COMPOSITE HAVING ELECTRICAL FUNCTIONALITY FOR APPLYING TO A SUBSTRATE

CROSS REFERENCE TO RELATED APPLICATIONS

This application is the National Stage of PCT/EP2015/053935 filed on Feb. 25, 2015, which claims priority under 35 U.S.C. 5119 of German Application No. 10 2014 102 519.9 filed on Feb. 26, 2014, the disclosure of which is incorporated by reference. The international application under PCT article 21(2) was not published in English.

The invention relates to a film composite with electrical functionality for application on a substrate. The invention further relates to a method for manufacture of such a film composite.

For example, printed or etched conductor tracks can be disposed on a circuit board for connection of components of electrical or electronic circuits. A further possibility consists in connecting the electronic components with one another via cables or wires. Via the conductor tracks, cables or wires, electrical signals can be transmitted or a voltage supply can be provided for operation of the components.

The manufacture of printed or etched conductive structures is associated with high costs and a high manufacturing complexity, especially due to expensive conductive pastes or as a consequence of the etching of the conductive structures by etching baths. Because of high preproduction costs for the necessary masks, for example for printing or etching masks, the manufacture of conductive structures by means of printing or etching techniques is worth the effort only for correspondingly high production figures. Besides the high manufacturing complexity and the expensive costs associated therewith, conductive structures on the basis of printed/etched conductor tracks or on the basis of cables or wires often have only a limited functionality. For example, a high electrical resistance occurs in particular with printed conductive pastes. Conductive structures vapor-deposited on a board also have high electrical resistance and low mechanical stability due to the thin conductor-track thickness. In addition, the thin structures make soldering impossible in many cases. From environmental viewpoints, the manufacture in particular of etched conductive structures is critical, since high environmental pollution results from the use of highly aggressive etching solutions.

The use of printed or etched conductive structures on a board leads to limited flexibility for the circuit design, because it involves a firmly joined composite between the electrically conducting structure and a backing.

Further restrictions exist with respect to the materials of a backing web on which the conductive structure is applied. Usually polyimide is used as backing material, and so transparency is lacking, even though it is often of interest, especially during application of the conductive structure in the environment of a light source.

Die-cut sheet-metal parts used heretofore for conductive structures are typically produced as bulk product or are integrated within a support structure, which in turn is associated with functional restrictions or at least leads to disadvantages in processing.

It is a concern of the present invention to provide a film composite with electrical functionality that can be applied in simple and flexible manner on a substrate. Furthermore, it is intended to specify a method for manufacture of such a film composite with electrical functionality that can be applied in simple and flexible manner on a substrate.

According to one embodiment, the film composite with electrical functionality for application on a substrate comprises at least one conductive structure, a first bonding coat, a film layer and a second bonding coat. The first bonding coat may be disposed on an underside of the at least one conductive structure. The first bonding coat may have an adhesive effect for application of the at least one conductive structure on the substrate. The second bonding coat may be disposed between an upper side of the at least one conductive structure and the film layer. The second bonding coat may have an adhesive effect, by which the film layer adheres to the at least one conductive structure.

The film composite may have a backing film, on which the at least one conductive structure and the film layer disposed over it are disposed. The film layer may extend beyond the at least one conductive structure and adhere to the backing film due to the second bonding coat, so that the film layer functions as a marking film for protection of the at least one conductive structure.

The film composite may be disposed in simple and flexible manner on a substrate, for example on a circuit board, on an operator-control panel or on housing parts. For this purpose the film composite comprising the at least one conductive structure and the film layer disposed over it is stripped from the backing film and applied with the first and second bonding coat on the substrate, for example by pasting or injection. The inventive film composite permits the transferability of the conductive structure to any other desired substrates.

The backing film may be punched out in such a way that the punched-out part of the backing film adheres at least to a partial region of the at least one conductive structure, so that the region of the first bonding coat that is disposed under the at least one conductive structure remains masked by the backing film when the film structure comprising the first bonding coat, the punched-out part of the backing film adhering underneath, the at least one conductive structure, the second bonding coat and the film layer is removed from the remaining backing film. During application on a substrate, the at least one conductive structure in this partial region does not adhere directly on the substrate. Thereby it is possible to prepare regions in the conductive structure that do not adhere but instead are protected by a portion of the backing film.

According to one possible embodiment, the at least one conductive structure, instead of adhering directly on the backing film, may be applied directly on a further film layer. The at least one conductive structure can adhere to the further film layer by means of the first bonding coat. The film composite may have a third bonding coat, which is disposed between the further film layer and the backing film. The third film layer may be pasted onto the backing film by means of the third bonding coat disposed on its underside together with the at least one conductive structure and the film layer disposed over it. In this embodiment, the at least one conductive structure is embedded between the film layer and the further film layer.

In the embodiment, the film structure comprising the further film layer, the at least one conductive structure disposed over it, the film layer and the first, second and third bonding coats may be stripped from the backing film during application and pasted onto a substrate by means of the third bonding coat.

In this embodiment also, a part of the backing film may be punched out from the other backing film and may adhere to the third bonding coat. Thus the punched-out part of the backing film adheres to the third bonding coat even after the stripping of the film structure comprising the further film layer, the at least one conductive structure and the film layer from the remaining backing film. During application of the film structure onto a substrate, for example a circuit board, the punched-out part of the backing film is therefore disposed between the third bonding coat and the substrate. At the unmasked portions, the further film layer adheres to the substrate by means of the third bonding coat.

A method for manufacture of a film composite with electrical functionality is specified in claim 10. According to one embodiment of the method, a backing film is prepared first. An electrically conductive film is disposed on the backing film. For production of the at least one conductive structure in the electrically conductive film, at least one first incision line is cut in a region of the electrically conductive film in such a way that the electrically conductive film is severed by the at least one first incision line in the region of the electrically conductive film and a first region of the backing film disposed under the region of the electrically conductive film remains intact, whereby at least one conductive structure is formed in the electrically conductive film, which is separated by the at least one incision line from a remaining part of the electrically conductive structure. For preparation of the at least one conductive structure, the remaining part of the electrically conductive film is removed. A film layer is disposed on an upper side of the at least one conductive structure. At least one second incision line is cut in a region of the film layer in such a way that the film layer is severed by the at least one second incision line in the region of the film layer and a second region of the backing film disposed under the region of the film layer remains intact.

According to a possible embodiment of the method, at least one third incision line, which severs the backing film before the application of the electrically conductive film, may be cut in the backing film. Simultaneously with the cutting of the at least one second incision line, at least one fourth incision line, which severs both the film layer and the backing film, may be cut in the film layer and in the backing film disposed underneath. In such an embodiment, the punched-out part of the backing film continues to adhere under a part of the at least one conductive structure after the stripping of the film layer from the backing film.

For contacting of the at least one conductive structure, a recess may be cut in the film layer so that, during arrangement of the at least one conductive structure on the film layer, a region of the at least one conductive structure is exposed for contacting.

With the film composite, a highly functional electrically conductive structure that is simple to handle and easy to contact is made available, thus opening up diverse use possibilities. For example, the film composite may be used for connection of components of electrical or electronic circuits, for manufacture of plug connections, for manufacture in particular of a capacitive or resistive sensor system, for heating or for antenna superstructures.

Figure 4:
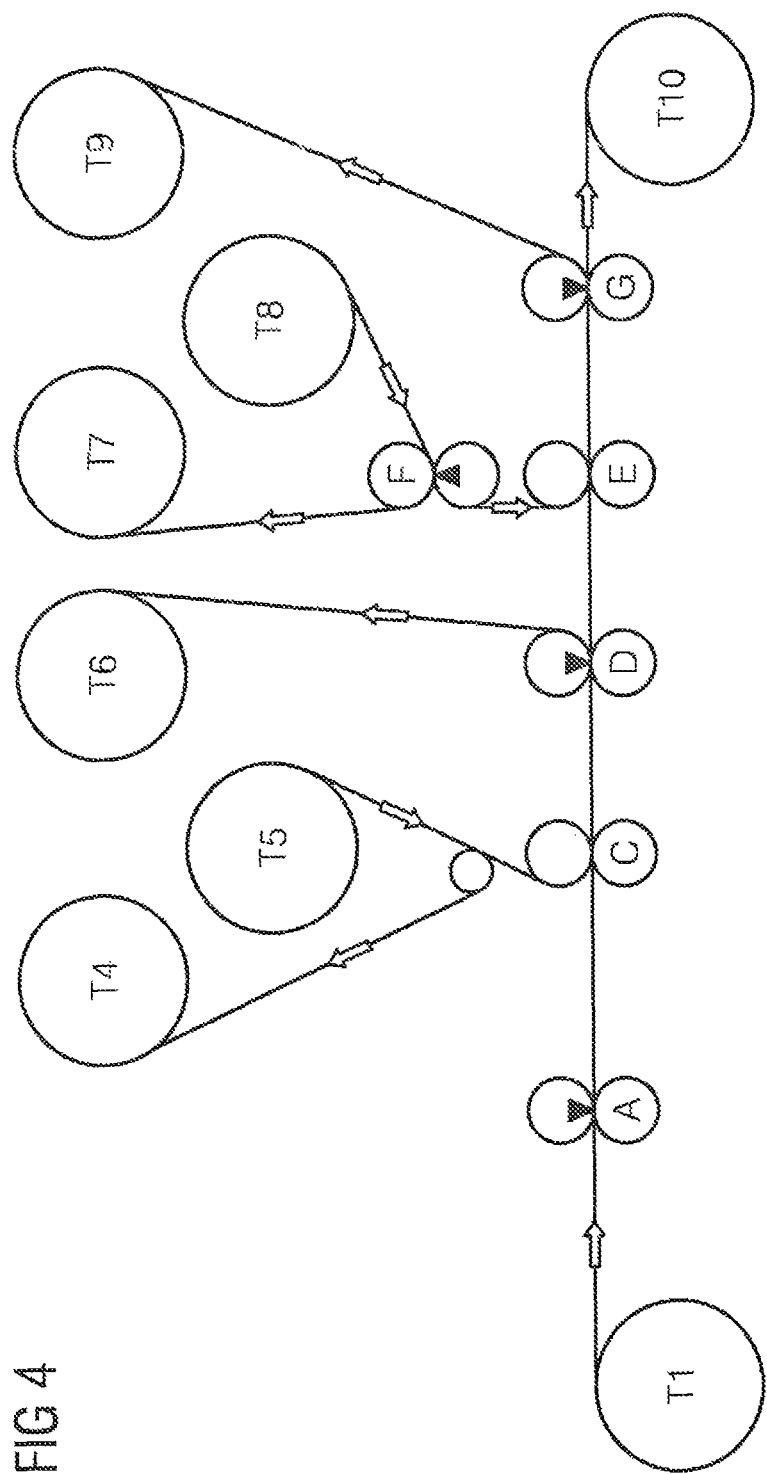
Figure 7:
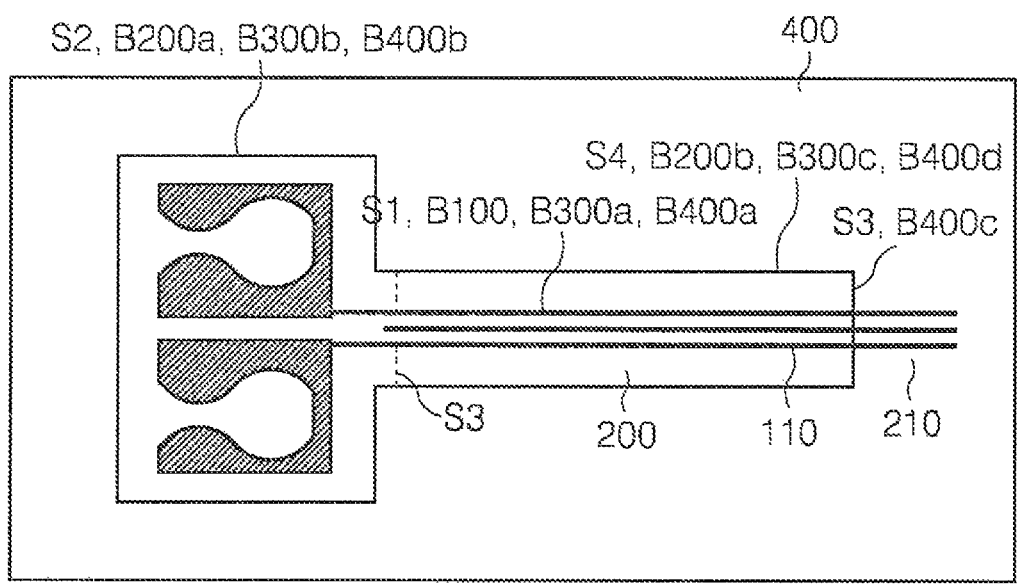
Figure 8:
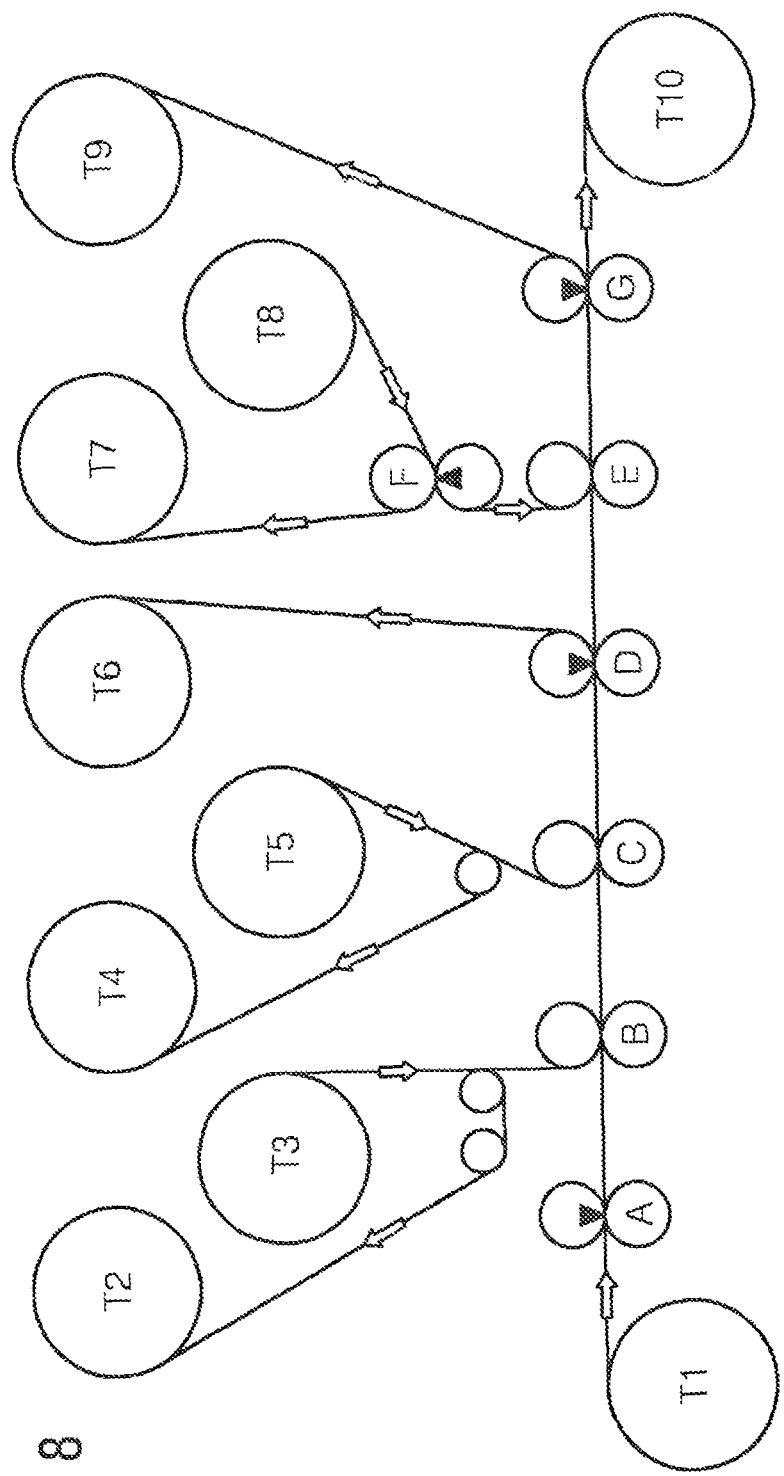

The invention will be explained in more detail in the following on the basis of figures, which show exemplary embodiments of the present invention, wherein:

FIG. 1 shows an embodiment of a film composite with an electrically conductive structure, FIG. 2A shows an embodiment of a film composite with an electrically conductive structure, prepared for contacting in a plug, FIG. 2B shows an embodiment of a film composite with an electrically conductive structure applied on a substrate, FIG. 3 shows an overhead view of an embodiment of a film composite with an electrically conductive structure, FIG. 4 shows an embodiment of a method for manufacture of a film composite with an electrically conductive structure, FIG. 5 shows an embodiment of a film composite with an electrically conductive structure, FIG. 6A shows an embodiment of a film composite with an electrically conductive structure, prepared for contacting in a plug, FIG. 6B shows an embodiment of a film composite with an electrically conductive structure applied on a substrate, FIG. 7 shows an overhead view of an embodiment of a film composite with an electrically conductive structure, FIG. 8 shows an embodiment of a method for manufacture of a film composite with an electrically conductive structure.

FIG. 1 shows a sectional view of an embodiment 1000 of a film composite with electrical functionality. The film composite comprises at least one conductive structure 110 and one bonding coat 10 disposed on an underside of the at least one conductive structure. The bonding coat 10 has an adhesive effect for application of the at least one conductive structure onto a substrate. Furthermore, the film structure has a film layer 200 and a bonding coat 20. The bonding coat 20 is disposed between an upper side of the at least one conductive structure 110 and the film layer 200. The bonding coat 20 has an adhesive effect, by which the film layer 200 adheres to the at least one conductive structure. The bonding coat 10 and the bonding coat 20 may be formed, for example, as an adhesive coating or as a primer, especially as a lacquer coat.

The film composite 1000 further comprises a backing film 400, on which the at least one conductive structure 110 and the film layer 200 are disposed. The bonding coat 10 disposed under the at least one conductive structure 110 adheres to the backing film 400. In particular, regions T10a and T10b of the bonding coat 10 adhere to the backing film. A region T10a of the at least one conductive structure 110 adheres to the region T10a of the bonding coat 10. Likewise a region T110b of the at least one conductive structure 110 adjoining the region T110a adheres to the region T10b of the bonding coat 10. The bonding coat 10 has an adhesive effect such that, on the one hand, the at least one conductive structure adheres securely to the backing film and such that, on the other hand, the at least one conductive structure 110 can be stripped together with the bonding coat 10 from the backing film 400.

A region T20a of the bonding coat 20 is disposed over the region T110a of the at least one conductive structure 110. A region T20b of the bonding coat 20 is disposed over the region T110b of the at least one conductive structure 110. Regions T200a and T200b of the film layer 200 adhere to the bonding coat 20 over the regions T20a and T20b of the bonding coat 20. Because of the bonding coat 20, the at least one conductive structure 110 is held reliably on the film layer 200, in order to protect the at least one conductive structure 110. The force of adhesion of the bonding coat 20 on the at least one conductive structure is greater than the force of adhesion of the bonding coat 10 on the backing film 400, and so the film structure comprising the bonding coat 10, the at least one conductive structure 110, the bonding coat 20 and the film layer 200 can be stripped as a whole from the backing film.

The film layer 200 has a region T200c and the bonding coat 20 disposed underneath the film layer 200 has a region T20c, wherein the region T200c of the film layer 200 and the region T20c of the bonding coat 20 extend beyond the at least one conductive structure 110. The region T20c of the bonding coat 20 also adheres to the backing film 400, and so the at least one conductive structure 110 is masked by the film layer 200. For better illustration in FIG. 1, the region T200c of the film layer 200 and the region T20c of the bonding coat 20 are illustrated as projecting freely beyond the conductive structure 110. The at least one conductive structure 110 is therefore embedded between the film layer 200 and the backing film 400.

For contacting of the at least one conductive structure 110, a recess 210 can be provided in one region of the film layer 200. Thus a portion A110a of the at least one conductive structure is masked by the film layer 200, whereas in the region of the recess 210 a portion A110b of the at Least one conductive structure 110 is exposed, meaning not masked by the film layer 200, and can be contacted from externally.

At least one incision line S3, which runs perpendicular to the sheet plane in FIG. 1 and completely severs the backing film, may be cut in the backing film 400. In the embodiment shown in FIG. 1, two incision lines S3 are cut in the backing film. It is also possible to cut, in the backing film, further incision lines that completely sever the backing film. Thereby a portion of the backing film that masks the at least one part of the conductive structure underneath may be cut out of the other backing film. During stripping of the film structure from the bonding coat 10, the at least one conductive structure 110, the bonding coat 20 and the film layer 200 of the backing film 400, the at least one punched out region of the backing film 400 under the part T110a of the at least one conductive structure 110 remains adhering. The further incision lines may run, for example, parallel to the at least one conducive structure or perpendicular to the incision lines S3.

With the electrically conductive structure, the film composite has an electrical functionality and can be used flexibly. The film structure comprising the bonding coat 10, the at least one conductive structure 110, the bonding coat 20 and the film layer 200 can be stripped in simple manner from the backing film and applied by means of the bonding coat 10 on a substrate. Furthermore, the electrically conductive structure can be coupled onto a plug. Corresponding embodiments of the film composite, prepared for coupling onto a plug or applied onto a substrate, are illustrated in FIGS. 2A and 2B. Like film components are denoted by like reference symbols as in FIG. 1.

FIG. 2A shows, by way of example, an embodiment of the film composite 1000 for contacting with a plug. When the nominal thickness in the plug region for contacting is greater than the thickness of the film composite, a part of the film composite that is disposed on one side of the recess 210 can be folded over, in order to increase the thickness of the film composite in the contacting region of the recess 210. For folding or kinking of the region of the film composite disposed next to the recess 210, a perforation P or another parting or weakening line, for example a crease, may be provided in the film composite. After the folding-over, the exposed portion of the at least one conductive structure 110 forms a so-called terminal lug for contacting the at least one conductive structure. Because of the folding-over, the thickness of the terminal lug can be increased to correspond to the nominal thickness of the plug and the stability in the region of the terminal lug can be increased. Furthermore, two-sided contacting of the terminal lug is possible.

FIG. 2B shows the remaining film structure comprising the film layer 200, the bonding coat 20, the at least one conductive structure 110 and the bonding coat 10 with the at least one part of the punched-out backing film 400 adhering to its underside after the stripping of the backing film 400 from the film composite 1000 and after the pasting onto a substrate 3000, for example an operator-control panel. The film structure is formed in such a way that, in the condition of the pasting onto the substrate 3000, the part T110a of the at least one conductive structure 110, the part T10a of the bonding coat 10, the part T20a of the bonding coat 20 and the part T200a of the film layer 200 remain on the backing film 400. The part T110b of the at least one conductive structure adheres by means of the part T10b of the bonding coat 10 directly on the substrate 3000. The part T200b of the film layer 200 disposed over the part T110b of the at least one conductive structure 110 adheres by means of the part T20b of the bonding coat 20 to the part T110b of the at least one conductive structure. The region T200c of the film layer 200 adjoining the portion T200b of the film layer 200 adheres directly to the substrate 3000 by means of the portion T20c of the bonding coat 20.

The exposed, non-masked region of the at least one conductive structure 110 forms a so-called terminal lug for contacting of the at least one conductive structure. The exposed portion of the at least one conductive structure adheres directly to the substrate 3000. According to a further possible embodiment, the conductive structure 110 with the bonding coat 10 disposed underneath it may be underlaid with the backing film 400 in the region of the terminal lug and thus does not adhere to the substrate.

FIG. 3 shows an overhead view of a possible configuration of the film composite 1000 comprising the backing coat 400, the at least one conductive structure 110 with the bonding coat 10 and the film layer 200 with the bonding coat 20. The manufacture of such a film composite with an electrically conductive structure 110 in the form of 2 touch sensors with supply lines and shielding will be explained in more detail in the following on the basis of FIG. 4 in conjunction with FIG. 3.

FIG. 4 shows an embodiment of a method for manufacture of the film composite 1000 with an electrically conductive structure. A web of the backing film 400, which can be unwound in the direction of a laminating device C, is disposed on a drum T1. A web of an electrically conductive film 100 with the bonding coat 10 disposed underneath it is wound onto a drum T5. In the method sketched in FIG. 4, the bonding coat 10 is formed, for example, as an adhesive coating, which is masked by a protective coat. The electrically conductive film 100 is unwound as a film web from drum T5. The protective coat is separated from the bonding coat 10 on a stripping unit, for example a deflecting roll, and wound onto a drum T4. The film 100 with the bonding coat 10 disposed underneath is fed to the laminating device C. On the laminating device C, the film 100 is arranged on the backing film 400. For this purpose the web of the film 100 can be laminated by means of the bonding coat 10 onto the web of the backing film 400.

The film structure comprising the backing film 400 and the electrically conductive film 100 laminated onto it is then fed to a die-cutting device D for punching-out of contours into the film 100. By means of the die-cutting device D, at least one incision line S1 is cut in a region B100 of the film 100 and the bonding coat 10 lying underneath this region in such a way that the film 100 and the bonding coat 10 lying underneath are severed by the at least one incision line S1 in the region B100 of the film 100 and a region B400a of the backing film 400 disposed under the region B100 of the film 100 remains intact. The regions B100 and B400a are shown in FIG. 3. By the cutting of the incision line S1, the structure of the at least one conductive structure 110 is formed in the film 100. The at least one conductive structure 110 is separated by the at least one incision line S1 from a remaining part of the film 100. At the output of the die-cutting device D, this remaining part of the film 100, also known as the grid, is stripped from the backing film 400 and wound onto a drum T6. Downstream from the die-cutting device D, at least one conductive structure 110 is arranged on the backing film 400.

A drum T8 contains a web of the film layer 200 with the bonding coat 20 applied underneath. Just as the bonding coat 10, the bonding coat 20 may be made as an adhesive coating. The film layer 200 is unwound from the drum T8 together with the bonding coat 20 and can be fed to a die-cutting device F. In the die-cutting device F, the recess 210 shown in FIG. 1 can be cut into the film layer 200 and the bonding coat 20, before the web of the film layer 200 is laminated onto the at least one conductive structure 110. The bonding coat 20 may be masked by a protective film. At the output of the die-cutting device F, the protective film is stripped and wound onto a drum T7.

The film web 200 coated with the bonding coat 20 is then fed to a laminating device E. In the laminating device E, the film layer 200 is arranged on an upper side of the at least one conductive structure 110 and of the backing-film web 400. For this purpose, the film layer 200 is laminated by means of the bonding coat 20 onto the at least one conductive structure 110 and the backing film 400 in the laminating device E.

The film structure comprising the backing film 400, the at least one conductive structure 110, which by means of the bonding coat 10 disposed underneath adheres to the backing film 400, and the film layer 200, which by means of the bonding coat 20 disposed underneath is pasted onto the upper side of the at least one conductive structure 110, is then fed to a die-cutting device G.

In the die-cutting device G, at least one incision line S2 is cut in a region B200a of the film layer 200 and of the bonding coat 20 lying underneath it in such a way that the film layer 200 and the bonding coat 20 lying underneath are severed by the at least one incision line S2 in the region B200a of the film layer 200 and a region B400b of the backing film 400 disposed under the region of the film layer 200 remains intact. In the die-cutting device G, therefore, the contour of the film structure comprising the bonding coat 10, the at least one conductive structure 110, the bonding coat 20 and the film layer 200 on the backing film 400 is punched out. The separated remaining grid of the film layer 200 is wound onto a drum T9. The remaining film composite 1000 is wound onto a drum T10.

According to one possible embodiment, a die-cutting device A may be disposed between the drum T1 and the laminating device C for punching-out of a portion of the backing film 400, which during stripping of the film structure comprising the bonding coat 10, the at least one conductive structure 110, the bonding coat 20 and the film layer 200 adheres under a part T110a of the at least one conductive structure. By means of the die-cutting device A, at least one incision line S3 can be cut into a region B400c of the backing film 400 in such a way that the backing film 400 is severed in the region B400c of the backing film. For example, the at least one incision line S3 can run perpendicular to the at least one conductive structure 110 in the backing film 400.

For punching-out of the portion of the backing film, at least one incision line S4 can be cut in the die-cutting device G in a region B200b of the film layer 200 and of the bonding coat 20 lying underneath and in a region B400d of the backing film 400 disposed under the region B200b of the film layer 200 in such a way that the film layer 200 and the bonding coat 20 are completely severed in the region B200b, as is the backing film 400 in the region B400d. The incision line S4 can run, for example, parallel to the course of the at least one conductive structure 110 and, for example, perpendicular to the at least one incision line S3. Because of the cutting of the incision lines S3 and S4, a part of the backing film remains adhering under the part T110a of the at least one conductive structure 110 after the stripping of the film structure comprising the bonding coat 10, the at least one conductive structure 110, the bonding coat 20 and the film layer 200 from the backing film 400.

In the embodiment, sketched on the basis of FIG. 4, of a manufacturing method for manufacture of the film composite shown in FIG. 1, the bonding coats 10 and 20 are formed, for example, as adhesive coatings, which are disposed underneath the electrically conductive film 100 or respectively the film layer 200. The bonding coats 10 and 20 may also be provided as separate coats, which are applied in the course of the manufacturing method onto the electrically conductive film 100 or respectively the film layer 200.

FIG. 5 shows a further embodiment of a film composite 2000 with electrical functionality. In contrast to the embodiment shown in FIG. 1, the film composite additionally has a film layer 300 and a bonding coat 30, which is disposed on the underside of the film layer 300. A region T300a of the film layer 300 adheres with its upper side to the region T10a of the bonding coat 10. A region T300b of the film layer 300 adjoining the region T300a adheres with its upper side to the region T10b of the bonding coat 10. A region T300c of the film layer 300 adjoining the region T300b of the film layer 300 adheres with its upper side to the region T20c of the bonding coat 20, which together with the region T200c of the film layer 200 disposed over it extends beyond the at least one conductive structure 110. Thus the at least one conductive structure 110 together with its regions T110a and T110b is embedded between the film layers 200 and 300.

All regions T30a, T30b and T30c of the bonding coat 30 adhere to the backing film 400. The bonding coat 30 may be formed, for example, as an adhesive coating or as a primer, especially as a lacquer coat. The bonding coat 30 is therefore disposed between the backing film 400 and the film layer 300. The adhesive effect of the bonding coat 30 is designed such that the film structure comprising the bonding coat 30, the film layer 300, the bonding coat 10, the at least one conductive structure 110, the bonding coat 20 and the film layer 200 adheres securely to the backing film and on the other hand can be stripped as a whole from the backing film 400, especially manually. The force of adhesion of the bonding coat 20 to the at least one conductive structure is higher than the force of adhesion of the bonding coat 30 to the backing film 400.

Otherwise the regions T100a, T10b of the bonding coat 10, the regions T110a, T110b of the at least one conductive structure 110, the regions T20a, T20b of the bonding coat 20 and the regions T200a, T200b of the film layer 200 adhere to one another as described on the basis of FIG. 1.

Incision lines S3, by which a part of the backing film 400 may be punched out from the backing film 400 in one direction, may be provided in the backing film 400. For complete punching-out of the portion of the backing film, a further incision line S4 is cut into the backing film, thus severing the backing film parallel, for example, to the at least one conductive structure 110 and thus perpendicular, for example, to the incision line S3. When the film structure comprising the bonding coat 30, the film layer 300, the bonding coat 10, the at least one conductive structure 110, the bonding coat 20 and the film layer 200 are lifted from the backing film 400, the punched-out part of the backing film 400 adheres to the part T30a of the bonding coat 30.

FIG. 6A shows an embodiment of the film structure comprising the bonding coat 30, the portion of the backing film 400 adhering underneath it, the film layer 300, the bonding coat 10, the at least one conductive structure 110, the bonding coat 20 and the film layer 200 remaining after the stripping of the backing film 400 from the film composite 2000 for fixation in a plug. When the film structure has a height smaller than the nominal thickness of a conductive structure in the contacting region of the plug, a part of the film structure that lies next to the recess 210 can be folded over to increase the thickness in the contacting layer of the plug, similarly to the embodiment of the film composite 1000 of FIG. 2A.

Figure GB shows the embodiment of the film composite 2000 after the stripping of the backing film and a subsequent application onto a substrate, for example onto an operator-control panel 3000. The film composite 2000 is formed in such a way that, in the condition of the part T110a of the conductive structure pasted onto the substrate 3000, the part T200a of the film layer 200 and the part T300a of the film layer 300 is disposed on the backing film 400. The backing film 400 is disposed directly on the substrate 3000. The parts T300b and T300c of the film layer 300 adhere to the substrate 3000 by means of the bonding coat 30 adhering directly to the substrate.

FIG. 7 shows an overhead view of a possible configuration of the film composite 2000 comprising the backing film 400, the bonding coat 30, the film layer 300, the bonding coat 10, the at least one conductive structure 110, the bonding coat 20 and the film layer 200. The manufacture of such a film composite with an electrically conductive structure 110, for example in the form of 2 touch sensors with supply line and shielding, will be explained in more detail in the following on the basis of FIG. 8 in conjunction with FIG. 7, wherein mainly the differences compared with the method illustrated in FIG. 4 will be discussed.

FIG. 8 shows an embodiment of a method for manufacture of a film composite 2000 with the electrically conductive structure 110. In contrast to the embodiment of the manufacturing method illustrated in FIG. 3, a laminating device B is provided between the drum T1 for unwinding of the web of the backing film 400 or respectively the optionally present die-cutting device A and the laminating device C. The laminating device B is coupled with a drum T3, on which a web of the film layer 300 is wound together with the bonding coat 30, which is made, for example, in the form of an adhesive coating, and may be disposed underneath the film layer 300, and with a protective coat applied on the bonding coat 30. The film layer 300 together with the bonding coat 30 and the protective coat is unwound from the drum T3. A film web of the protective coat is then wound onto a stripping unit, for example a deflecting roll, from which the bonding coat 30 is stripped and wound onto a drum T2.

The remaining web comprising the film layer 300 and the bonding coat 30 is fed to the laminating device B. In the laminating device B, the film layer 300 together with the bonding coat 30 is laminated onto the backing film 400.

In the laminating device C, the film layer 100 is then laminated onto the film layer 300 by means of the bonding coat 10. Furthermore, by means of the die-cutting device D, the contour of the at least one conductive structure 110 is punched out of the film layer 100 by cutting an incision line S1 into a region B100 of the electrically conductive film 100 and the bonding coat 10 disposed underneath and severing the film layer 100 and the bonding coat 10, albeit without severing a region B300a of the film layer 300 and of the bonding coat 30 disposed underneath as well as a region B400a of the backing film disposed under the region B300a.

After the stripping of the punched-out grid of the electrically conductive film 100, the film layer 200 is laminated onto the at least one conductive structure 110 and the film layer 300 in the laminating device E. In the die-cutting device G, the at least one incision line S2 is cut into the film composite in such a way that a region B200a of the film layer 200 and of the bonding coat 20 disposed underneath as well as a region B300b of the film layer 300 disposed under the region B200a of the film layer 200 and of the bonding coat 30 disposed underneath are completely severed. A region B400b of the backing film 400 disposed under the region B300b remains intact.

According to one possible embodiment, at least one incision line S4 can be cut in die-cutting device G into a region B200b of the film layer 200 and of the bonding coat 20 as well as into a region B300c of the film layer 300 disposed under the region B200b of the film layer 200 and of the bonding coat 30 as well as into a region B400d of the backing film 400 disposed under the region B300c of the film layer 300 in such a way that the film layer 200 together with the bonding coat 20 is completely severed in the region B200b, as are the film layer 300 together with the bonding coat 30 in the region B300c and the backing film 400 in the region B400d. The incision line S4 may run parallel, for example, to the at least one conductive structure 110 and perpendicular, for example, to the at least one incision line S3, which is cut into the backing film 400 in the die-cutting device A.

In the embodiment, sketched on the basis of FIG. 8, of the manufacturing method for manufacture of the film composite shown in FIG. 5, the bonding coats 10, 20 and 30 are formed, for example, as adhesive coatings, which are disposed underneath an electrically conductive film 100, the film layer 200 and the film layer 300. The bonding coats 10, 20 and 30 may also be provided as separate coats, which are applied in the course of the manufacturing method onto the electrically conductive film 100 or respectively the film layers 200 and 300.

In the film composite 1000 and 2000, the portions A110b of the at least one conductive structure 110 exposed by the recess 210 can be protected from corrosion by using, for example a tinned conductor film as film 100.

If the conducting coat has corrosion tendency, the further possibility exists of subsequently tinning the exposed terminal lugs A110b or other exposed regions. According to a further embodiment, printable conductive paste, for example carbon paste or silver paste, may be printed in the relevant region of the terminal lugs. Optionally, this may be done already before the manufacturing process, during the manufacturing process or even after it. A further possibility of corrosion protection consists in casting the terminal lugs at least in the contacting region after contacting of the film composite in a subassembly. For this purpose, for example, a plug may be cast internally with potting compound.

When the bonding coats 10, 20 and 30 are formed as adhesive coatings on the electrically conductive film 100 and the film layers 200 and 300, various types of adhesives, for example heat-reactive adhesives or printable adhesives may be used to bond the individual layers of the film composite securely and thus stabilize them mechanically.

Likewise the use of transfer adhesives, which are formed as pure adhesive coating, is possible, as is alternatively the use of double-sided adhesive tapes, meaning an adhesive coating with reinforcement by, for example, an intermediate layer of film or paper. The adhesive coatings can be formed as detachably adhering or permanently adhering adhesives. The forces of adhesion of the respective adhesive must be matched to the detachment behavior of the surface to be applied. These forces of adhesion should preferably lie in the range of 0.01 N/25 mm to 50 N/25 mm.

In the region of the terminal lug, the backing film can be formed without die-cutting or slitting. In this case the adhesive coating of the terminal lug is open downward after the stripping of the backing film. If the backing film is provided with a die cut or respectively slit S3 and S4 in the region of the terminal lug, the terminal lug may be masked on its underside by the punched-out part of the backing film.

The recess 210 in the film layer 200 may be omitted if the contacting is established, for example, by crimping or by contactless electrical coupling, for example by induction. The recess 210 in the film layer 200 may be cut either before lamination by die-cutting of a hole and removal of the remaining material. The recess may also be cut after the lamination, if for this purpose the region of the recess is prepared by use of locally differentiated forces of adhesion or a differentiation of forces of adhesion by a printed adhesive mask. In addition to or as an alternative to the cutting of a recess, the film layer 200 can be made narrower in the region of the contacting, so that certain conductive parts of the structure remain free for the contacting.

The cutting of contours in the individual film layers can be achieved not only by die-cutting but also alternatively by other separation methods, for example by plotter cutting, laser cutting or water-jet cutting.

Besides the film composites shown in FIGS. 1 and 5, a simple film composite with electrical functionality for application on a substrate as illustrated in FIG. 1, but without the bonding coat 20 and the film layer 200, can be formed. In this embodiment the film composite has only the at least one conductive structure with the bonding coat 10, which adheres to the backing film 400, disposed underneath. For application of the at least one conductive structure, the at least one conducive structure 110 can be stripped from the backing film 400 and transferred onto a substrate. The at least one conductive structure 110 adheres to the substrate by means of the bonding coat 10.

The simplified film structure as well as the film structure, shown in FIG. 1, comprising the bonding coat 10, the portion of the backing film 400 optionally adhering to the bonding coat 10, the at least one conductive structure 110, the bonding coat 20 and the film layer 200 or respectively the film structure, shown in FIG. 5, comprising the bonding coat 30, the portion of the backing film 400 optionally adhering to the bonding coat 30, the bonding coat 10, the at least one conductive structure 110, the bonding coat 20 and the film layer 200 may also be disposed in a stack arrangement on the backing film 400. In this embodiment, a multi-layer structure of several film superstructures with at least one conductive structure is formed on the backing film. The individual conductive structures may be used for various applications and be differently coupled.

LIST OF REFERENCE SYMBOLS 10, 20, 30 Bonding coat
100 Electrically conductive film
110 Conductive structure
200, 300 Film layer
400 Backing film
1000, 2000 Film composite with electrical functionality
A Die-cutting device
B Laminating device
C Laminating device
D Die-cutting device
E Laminating device
G Die-cutting device
S1, S2, S3, S4 incision lines

The invention claimed is:

1. Film composite with electrical functionality for application on a substrate, comprising:
   at least one conductive structure,
   a first bonding coat,
   a film layer,
   a second bonding coat,
   a backing film, on which the at least one conductive structure and the film layer are disposed,
   wherein the first bonding coat is disposed on an underside of the at least one conductive structure,
   wherein the first bonding coat has an adhesive effect for application of the at least one conductive structure on the substrate,
   wherein the second bonding coat is disposed between an upper side of the at least one conductive structure and the film layer,
   wherein the second bonding coat has an adhesive effect, by which the film layer adheres to the at least one conductive structure,
   wherein the at least one conductive structure and the film layer disposed over the at least one conductive structure are configured to be stripped at least partly from the backing film for application on the substrate.

2. Film composite according to claim 1, wherein the film layer and the second bonding coat respectively have a region that extends beyond the at least one conductive structure.

3. Film composite according to claim 2, comprising
   a further film layer,
   wherein the further film layer, the at least one conductive structure and the film layer are disposed on the backing film,
   wherein the further film layer adheres with its upper side to the first bonding coat and to the region of the second bonding coat extending beyond the at least one conductive structure.

4. Film composite according to claim 3, comprising
   a third bonding coat,
   wherein the third bonding coat is disposed between the further film layer and the backing film,
   wherein the third bonding coat has an adhesive effect, by which the further film layer adheres to the backing film.

5. Film composite according to claim 4,
   wherein the film composite can be pasted onto a substrate,
   wherein the film composite is formed in such a way that, in the condition of the film composite pasted onto the substrate, a respective first part of the at least one conductive structure, of the film layer and of the further film layer is disposed on the backing film and the backing film is disposed directly on the substrate and a second part of the further film layer adheres to the substrate by means of the third bonding coat.

6. Film composite according to claim 3,
   wherein the backing film has at least one incision line that severs the backing film.

7. Film composite according to claim 2,
wherein the region of the second bonding coat extending beyond the at least one conductive structure adheres to the backing film,
wherein the first bonding coat adheres to the backing film.

8. Film composite according to claim 7,
wherein the film composite can be pasted onto a substrate,
wherein the film composite is formed in such a way that, in the condition of the film composite pasted onto the substrate, a respective first part of the at least one conductive structure and of the film layer is disposed on the backing film and the backing film is disposed directly on the substrate and a second part of the at least one conductive structure adheres on the substrate by means of the first bonding coat and a second part of the film layer adheres to the second part of the at least one conductive structure by means of the second bonding coat and a third part of the film layer adheres to the substrate by means of the second bonding coat.

9. Film composite according to claim 1,
wherein a first portion of the at least one conductive structure is masked by the film layer,
wherein a second portion of the at least one conductive structure is not masked by the film layer.

10. Method for manufacture of a film composite with an electrically conductive structure, comprising:
preparation of a backing film,
arrangement of an electrically conductive film on the backing film,
cutting of at least one first incision line in a region of the electrically conductive film in such a way that the electrically conductive film is severed by the at least one first incision line in the region of the electrically conductive film and a first region of the backing film disposed under the region of the electrically conductive film remains intact, whereby at least one conductive structure is formed in the electrically conductive film, which is separated by the at least one incision line from a remaining part of the electrically conductive structure,
removal of the remaining part of the electrically conductive film,
arrangement of a film layer on an upper side of the at least one conductive structure,
cutting of at least one second incision line in a region of the film layer in such a way that the film layer is severed by the at least one second incision line in the region of the film layer and a second region of the backing film disposed under the region of the film layer remains intact.

11. Method according to claim 10, comprising:
cutting of at least one third incision line in a third region of the backing film, in such a way that the backing film is severed in the third region of the backing film,
cutting of at least one fourth incision line in a second region of the film layer and a fourth region of the backing film disposed under the second region of the film layer, in such a way that the film layer is severed in the second region and the backing film is severed in the fourth region, wherein the at least one third and fourth incision lines intersect in such a way that a region cut-out from the backing film is formed.

12. Method according to claim 10, comprising:
preparation of a first bonding coat with an adhesive effect and application of the first bonding coat on an underside of the electrically conductive film,
preparation of a second bonding coat with an adhesive effect and application of the second bonding coat on an underside of the film layer,
lamination of the electrically conductive film onto the backing film by means of the first bonding coat,
lamination of the film layer onto the at least one conductive structure and the backing film by means of the second bonding coat.

13. Method according to claim 12, comprising:
cutting of a recess in the film layer and the second bonding coat, before the film layer is laminated onto the at least one conductive structure.

14. Method according to claim 10, comprising:
preparation of a first bonding coat with an adhesive effect and application of the first bonding coat on an underside of the electrically conductive film,
preparation of a second bonding coat with an adhesive effect and application of the second bonding coat on an underside of the film layer,
preparation of a further film layer,
preparation of a third bonding coat with an adhesive effect and application of the third bonding coat on an underside of the further film layer,
lamination of the further film layer onto the backing film by means of the third bonding coat,
lamination of the electrically conductive film onto the further film layer by means of the first bonding coat,
cutting of the at least one first incision line in the region of the electrically conductive film in such a way that a first region of the further film layer disposed under the region of the electrically conductive film remains intact,
lamination of the film layer onto the at least one conductive structure and the further film layer by means of the second bonding coat,
cutting of the at least one second incision line in a second region of the further film layer disposed under the region of the film layer in such a way that the further film layer is severed in the second region of the further film layer by means of the at least one second incision line.

15. Method according to claim 14, comprising:
cutting of at least one third incision line in a third region of the backing film in such a way that the backing film is severed in the third region of the backing film,
cutting of at least one fourth incision line in a second region of the film layer and in a third region of the further film layer disposed under the second region of the film layer and a fourth region of the backing film disposed under the third region of the further film layer, in such a way that the film layer is severed in the second region and the further film layer is severed in the third region and the backing film is severed in the fourth region, wherein the at least one third and fourth incision lines intersect in such a way that a region cut-out from the backing film is formed.

* * * * *